(12) United States Patent
Lee

(10) Patent No.: US 11,561,467 B1
(45) Date of Patent: Jan. 24, 2023

(54) REFLECTIVITY AND TRANSMITTANCE MEASURING DEVICE OF EUV MASK AND EUV PELLICLE

(71) Applicant: ESOL Inc., Hwaseong-si (KR)

(72) Inventor: Dong Gun Lee, Hwaseong-si (KR)

(73) Assignee: ESOL Inc., Hwaseong-si (KR)

( * ) Notice: Subject to any disclaimer, the term of this patent is extended or adjusted under 35 U.S.C. 154(b) by 0 days.

(21) Appl. No.: 17/570,406

(22) Filed: Jan. 7, 2022

(30) Foreign Application Priority Data

Oct. 15, 2021 (KR) ................. 10-2021-0137573

(51) Int. Cl.
  *G03F 1/84* (2012.01)
  *G03F 1/24* (2012.01)
  *G03F 7/20* (2006.01)
(52) U.S. Cl.
  CPC .............. *G03F 1/84* (2013.01); *G03F 1/24* (2013.01); *G03F 7/70616* (2013.01)
(58) Field of Classification Search
  CPC ........... G03F 1/84; G03F 1/24; G03F 7/70616
  See application file for complete search history.

(56) References Cited

U.S. PATENT DOCUMENTS

| 6,864,490 B1 | 3/2005 | Underwood et al. |
| 7,738,135 B2 | 6/2010 | Morita |
| 2013/0161543 A1* | 6/2013 | Park ................. G02B 5/1857 250/550 |
| 2015/0002925 A1 | 1/2015 | Endres |
| 2022/0167492 A1* | 5/2022 | Na ....................... G21K 1/10 |

FOREIGN PATENT DOCUMENTS

| KR | 10-1370203 B1 | 3/2014 |
| KR | 10-2020-0121545 A | 10/2020 |
| KR | 10-2020-0121546 A | 10/2020 |

* cited by examiner

*Primary Examiner* — Peter B Kim
(74) *Attorney, Agent, or Firm* — Revolution IP, PLLC

(57) ABSTRACT

A reflectivity and transmittance measuring device includes: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate.

7 Claims, 12 Drawing Sheets

REFLECTIVITY AND TRANSMITTANCE MEASURING DEVICE OF EUV MASK AND EUV PELLICLE

BACKGROUND OF THE INVENTION

Field of the Invention

The present invention relates to a reflectivity and transmittance measuring device of an extreme ultraviolet (EUV) mask and an EUV pellicle, and more particularly, to a high performance EUV reflectivity and transmittance measuring device for measuring reflectivity and transmittance of an extreme ultraviolet (EUV) photo mask or an EUV pellicle among semiconductor materials.

Background Art

Exposure is the core process in semiconductor technology development. Now, not ArF exposure technology using a wavelength of 193 nm but EUV exposure technology using a wavelength of 13.5 nm is used, and a miniaturized process is carried out utilizing next-generation exposure equipment.

An EUV pellicle is a thin film for protecting an EUV mask, serves to prevent a mask from being polluted by a defect, and can improve a defect rate when a miniaturized pattern is formed. Transmittance of the protective film and uniformity of the transmittance directly have an influence on a semiconductor exposure yield. Therefore, management in transmittance quality of EUV pellicle materials is very important in production management of the EUV pellicles.

Moreover, it is important to manage reflectivity of the EUV pellicle since light reflected from the EUV pellicle generates an error in a part overlapped and exposed to a semiconductor wafer.

The quality management in transmittance and reflectivity of the EUV pellicle is carried out through management of a transmittance/reflectivity measuring process using an EUV transmittance and reflectivity measuring device.

In order to smoothly apply the EUV mask to a mass production process, like the ArF mass production technology, it is necessary to manage the quality of the EUV pellicle through a transmittance and reflectivity measuring device of an EUV pellicle which is a protective film of an EUV mask. In order to realize the device, differently from the existing ArF transmittance measuring device, development of a new transmittance and reflectivity measuring device to which EUV light and an EUV optical system are applied is necessary.

FIG. 1 is a configuration diagram of a reflectivity measuring device according to a conventional art. The reflectivity measuring device according to the conventional art of FIG. 1 radiates EUV monochromic light to a sample using an EUV light source 30 of a laser produced plasma (LPP) type which radiates ND:YAG Q-switched pulse laser to a metal target to form plasma and generate EUV light and using a monochromator 32 having an oblique incidence mirror 34, a grating 34, and a slit 42, divides reflected light 58 and transmitted light 56 using a beam splitter 54 so that the reflected light 58 is detected and forms a reference signal to monitor a change of the light source and the transmitted light 56 is reflected from a mask sample 70 and forms a sample reflection signal on a detector, and measures reflectivity of the mask sample using the reference signal 58 and the sample reflection signal 66.

FIG. 1 is a configuration diagram of a reflectivity and transmittance measuring device of an EUV mask and an EUV pellicle according to the present invention. The measuring device radiates only monochromic EUV light to an EUV pellicle using an EUV lamp as a light source and using an ML spectral filter and an SPF, detects light intensity using two photo sensors for measuring reflectivity and transmittance, and measures transmittance and reflectivity of the EUV pellicle through measurement of transmittance and reflectivity signals according to the existence of samples.

The conventional arts have a disadvantage in that measurement precision is very deteriorated since radiating light to a sample without removing IR light from the light output from the EUV light source. Accordingly, it is difficult to manufacture high-performance EUV masks and pellicles, and it causes deterioration in production yield.

PATENT LITERATURE

Patent Documents

U.S. Pat. No. 6,864,490
Korean Patent Publication No. 10-2020-0121546
Korean Patent Publication No. 10-2020-0121545
US Patent Publication No. 2015-0002925
U.S. Pat. No. 7,738,135
Korean Patent No. 10-1370203

SUMMARY OF THE INVENTION

Accordingly, the present invention has been made to solve the above-mentioned problems occurring in the prior arts, and it is an object of the present invention to provide a reflectivity and transmittance measuring device of an extreme ultraviolet (EUV) mask and an EUV pellicle, which can precisely measure EUV transmittance and reflectivity of an EUV mask and an EUV pellicle.

It is another object of the present invention to provide a high-performance EUV optical system for measuring reflectivity of an EUV mask and transmittance and reflectivity of an EUV pellicle, and also provide a measuring method of reflectivity of an EUV mask and transmittance and reflectivity of an EUV pellicle.

Especially, it is another object of the present invention to provide an EUV mask inspection device using a multilayer reflection zone plate, which can emulate freeform pupil illumination of an EUV exposure machine or provide uniform illumination beam required in an EUV inspection system by adjusting a duty cycle of a pattern or the height of an absorber by each position on a multilayer reflection zone plate, thereby precisely inspecting an EUV mask.

To accomplish the above object, according to the present invention, there is provided a reflectivity and transmittance measuring device of an extreme ultraviolet (EUV) mask and an EUV pellicle, which includes: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate, the reflectivity and transmittance measuring device including: a first aperture for providing monochromatic light or reducing a light radiation area by reducing a linewidth of optical wavelength radiated from the EUV lighting unit; a double-sided detector which detects reference light relative to the incidence direction of light passing through the aperture and has optical detection units disposed at both sides thereof to detect again the light reflected after being radiated to the EUV mask after passing through a hole formed at the center; and an optical detector for detecting the light transmitted after being radiated to the EUV mask after passing through a central hole formed in the double-sided detector.

Moreover, the multilayer reflection zone plate includes: one planar substrate; an EUV reflective multilayer film stacked on the planar substrate; and a zone plate pattern formed on the surface or the inner face of the EUV reflective multilayer film.

Furthermore, the zone plate pattern is formed on the EUV reflective multilayer film by repeatedly stacking at least two or more reflective materials, and the zone plate pattern is formed in such a way that absorber materials are stacked along a predetermined pattern, that the EUV reflection multilayer film is etched along the predetermined pattern, or that an absorber material is stacked and the EUV reflection multilayer film is stacked on the absorber material.

Additionally, the zone plate pattern is formed on the surface or the inner face of the EUV reflective multilayer film in such a way that absorber materials are stacked along a predetermined pattern, that the EUV reflection multilayer film is etched along the predetermined pattern, or that an absorber material is stacked and the EUV reflection multilayer film is stacked on the absorber material.

In addition, the double-sided detector further comprises a second aperture formed in the surface of the optical detector in order to measure some of reflected light of measured light radiated from the EUV mask when some of the reflected light passes through the second aperture.

Moreover, the second aperture includes: a first hole formed at the center so that the measured light radiated to the EUV mask passes through the first hole; and a second hole formed to be distant from the first hole so that the light reflected after the measured light is radiated to the EUV mask passes through the second hole.

Furthermore, the zone plate pattern has a circular or oval shape. The zone plate is an off-axis zone plate that the center of the circular or oval pattern does not exist in the multilayer reflection zone plate, or is an on-axis zone plate that the center of the circular or oval pattern exists in the multilayer reflection zone plate. In the case of the off-axis zone plate, the center of zeroth light and the center of first light head in different directions, and in the case of the on-axis zone plate, the center of zeroth light and the center of first light are in the same direction.

In another aspect of the present invention, there is provided a reflectivity and transmittance measuring device of an extreme ultraviolet (EUV) mask and an EUV pellicle, which includes: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate, the reflectivity and transmittance measuring device including: a first aperture for providing monochromatic light or reducing a light radiation area by reducing a linewidth of optical wavelength radiated from the EUV lighting unit; a beam splitter for transmitting some of the light passing through the first aperture and reflecting some of the light; and at least one optical detector for detecting light reflected from the beam splitter, light reflected from the EUV mask after transmission, and light transmitted through the EUV mask.

Moreover, the multilayer reflection zone plate includes: one planar substrate; an EUV reflective multilayer film stacked on the planar substrate; and a zone plate pattern formed on the surface or the inner face of the EUV reflective multilayer film.

Furthermore, the zone plate pattern is formed on the EUV reflective multilayer film by repeatedly stacking at least two or more reflective materials, and the zone plate pattern is formed in such a way that absorber materials are stacked along a predetermined pattern, that the EUV reflection multilayer film is etched along the predetermined pattern, or that an absorber material is stacked and the EUV reflection multilayer film is stacked on the absorber material.

The reflectivity and transmittance measuring device of an EUV mask and an EUV pellicle according to the present invention can precisely measure reflectivity and transmittance of the EUV mask or the EUV pellicle using the high-performance EUV light source and the optical system, support to stably manufacture a high-performance EUV mask and an EUV pellicle, and considerably contribute to wafer yield improvement and reduction of semiconductor manufacturing costs.

The reflectivity and transmittance measuring device according to the present invention can be easily applied to apparatuses, is short in a development period of time, and requires low expenses since having a smaller number of components than the conventional optical system having the existing mirror.

Because the reflection zone plate not to which the existing oblique incidence reflection zone plate parts are applied does not have the multilayer film, beam is injected into the zone plate at oblique incidence (at an incidence angle of 86 degrees) for soft ray reflection and solid angles collected to the zone plate are small. Therefore, the present invention can solve the problem that light harvesting efficiency is deteriorated.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Hereinafter, a reflectivity and transmittance measuring device of an EUV mask and an EUV pellicle according to the present invention will be described in detail with reference to the accompanying drawings.

The reflectivity and transmittance measuring device of an EUV mask and an EUV pellicle used in an EUV exposure process of a semiconductor device manufacturing process includes: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate. The EUV mask inspection device further includes: a first aperture for providing monochromatic light or reducing a light radiation area by reducing a linewidth of optical wavelength radiated from the EUV lighting unit; a double-sided detector which detects reference light relative to the incidence direction of light passing through the aperture and has optical detection units disposed at both sides thereof to detect again the light reflected after being radiated to the EUV mask after passing through a hole formed at the center; and an optical detector for detecting the light transmitted after being radiated to the EUV mask after passing through a central hole formed in the double-sided detector.

The reflectivity and transmittance measuring device of an EUV mask or an EUV pellicle according to the present invention includes a lighting unit using a multilayer reflection zone plate, a double-sided detector for measuring reference light and reflected light, and an optical detector for measuring transmittance of an EUV mask or an EUV pellicle.

Figure 1:
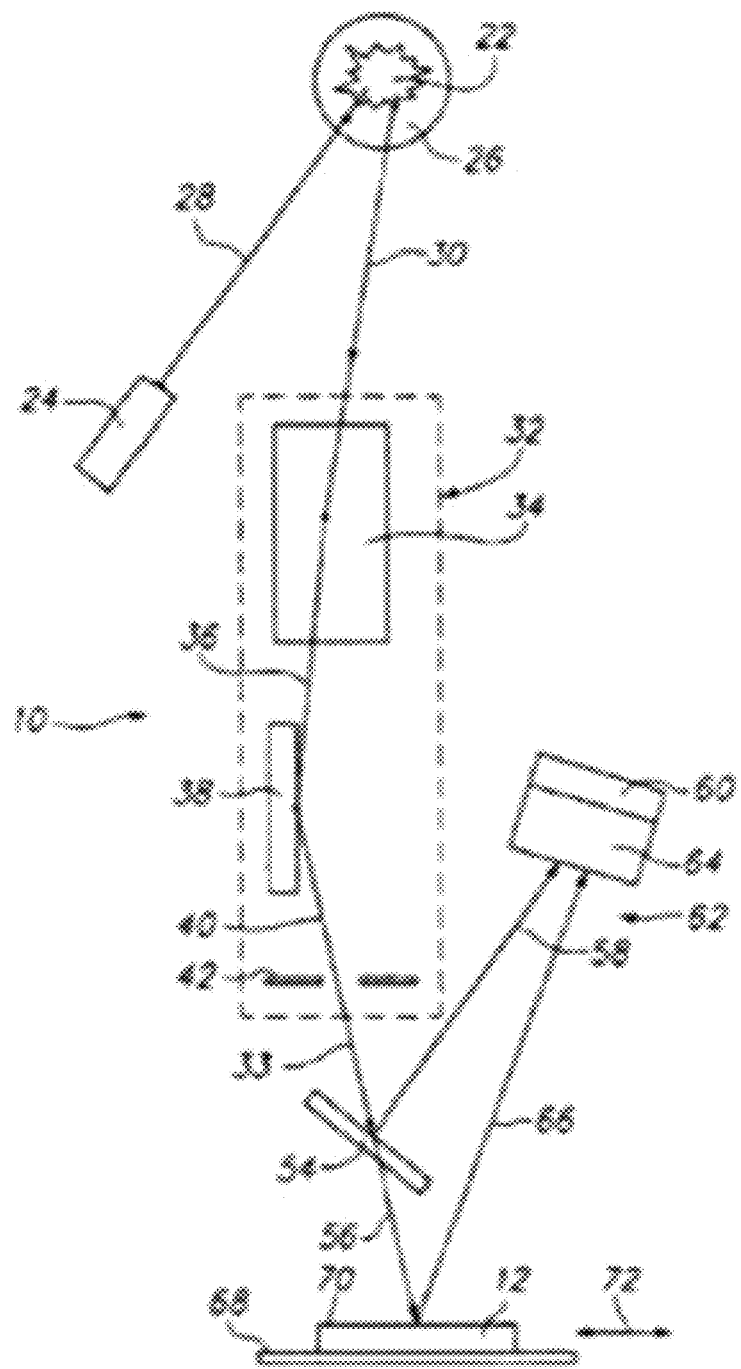
FIG. 1 is a configuration diagram of a reflectivity measuring device according to a conventional art.
Figure 2:
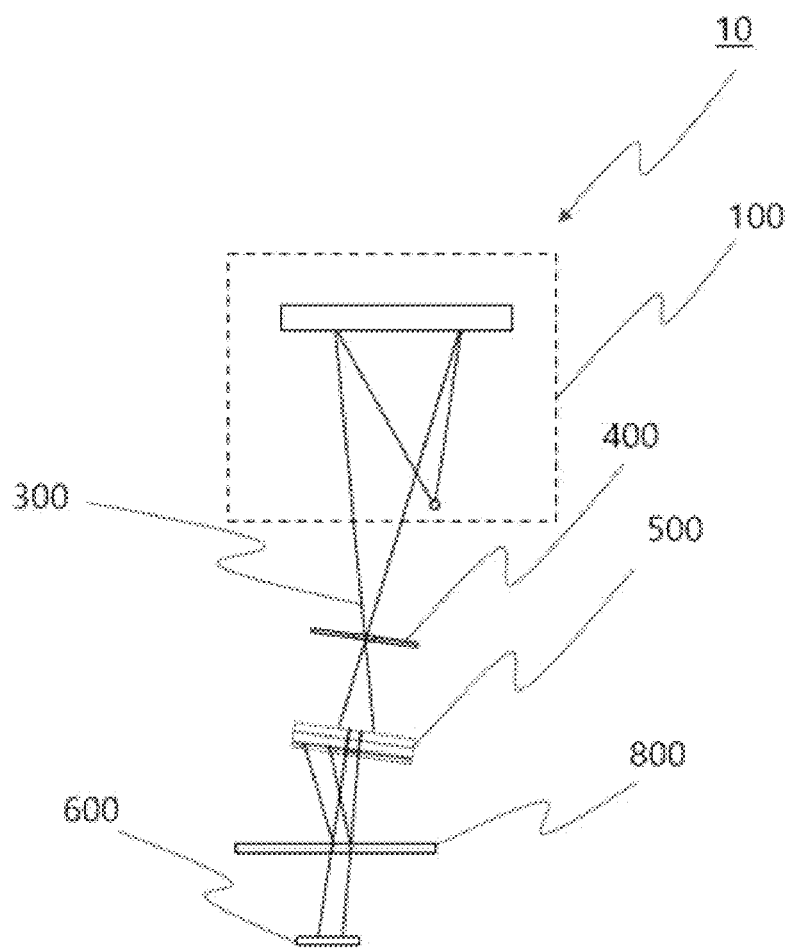
FIG. 2 is a configuration diagram of a reflectivity and transmittance measuring device of an EUV mask and an EUV pellicle according to the present invention.

FIG. 2 is a configuration diagram of the reflectivity and transmittance measuring device of the EUV mask and the EUV pellicle according to the present invention.

As illustrated in the drawing, an inspection device 10 according to the present invention includes one lighting unit 100 having a multilayer reflection zone plate to create illumination light 300, a first aperture 400 for determining the size of the illumination light, one double-sided detector 500 for measuring reference light relative to the illumination light provided from the lighting unit and measuring reflectivity and transmittance of an EUV mask 800 or an EUV pellicle 800 which is a measurement target, and an optical detector 600 for detecting light transmitted to the measurement target.

As a device for collecting and dividing generated EUV light, not the existing monochromic light device having a mirror, a grating and a slit but a multilayer reflection zone plate and an aperture are applied. The multilayer reflection zone plate has a zone plate formed on an EUV mirror, and the EUV mirror of a multilayer film structure reflects EUV light and the zone plate diffracts reflected light so that the diffracted beam is collected to the aperture. The device having the multilayer reflection zone plate and the aperture can provide light harvesting efficiency higher than the conventional device which collects beam through a mirror at incidence angles close to 86 degrees since collecting beam at angles close to vertical angles, and can easily align the optical system since the mirror and the grating of the conventional device are substituted with the multilayer reflection zone plate which is a single part.

Next, referring to FIGS. 3 to 8, the configuration of the lighting unit 100 which is a technical part of the present invention will be described in detail.

Figure 3:
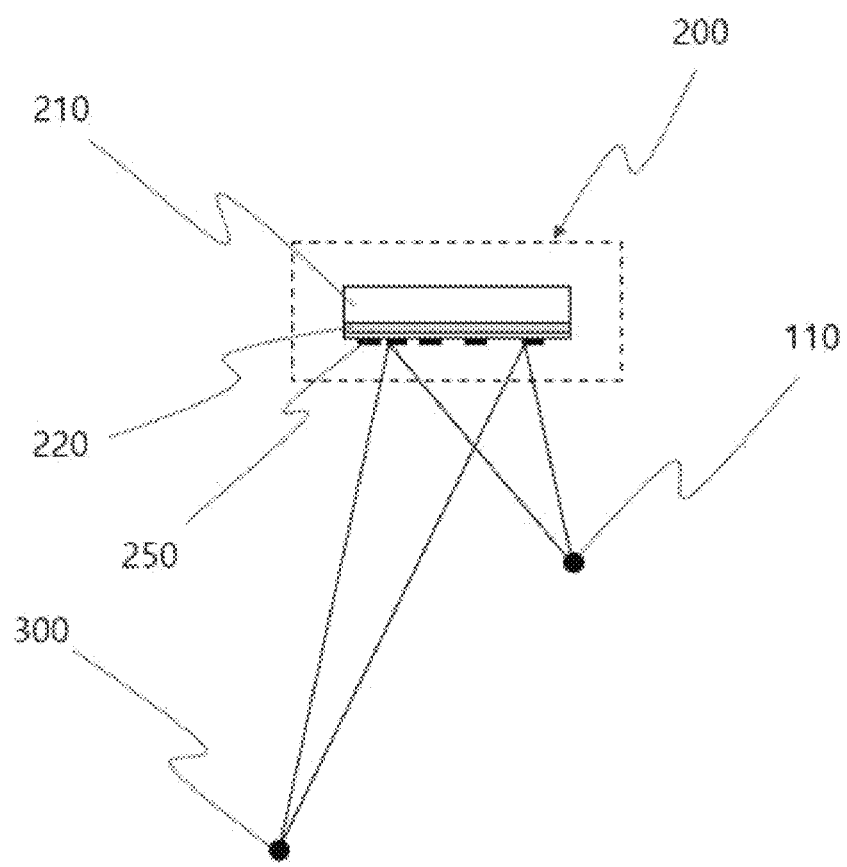
FIG. 3 is a configuration diagram of a lighting unit of the reflectivity and transmittance measuring device of the EUV mask and the EUV pellicle according to the present invention.

FIG. 3 is a configuration diagram of a lighting unit of the reflectivity and transmittance measuring device of the EUV mask and the EUV pellicle according to the present invention.

The EUV mask inspection device 10 using the multilayer reflection zone plate 200 according to the present invention is characterized by the lighting unit 100, which forms an EUV reflection multilayer film 220 as a planar substrate, forms a zone plate pattern 250 on the EUV reflection multilayer film 220, and outputs illumination light 300 using light reflected after the EUV light output from the EUV light source 100 is radiated to the multilayer reflection zone plate 200.

The EUV lighting unit 100 according to the present invention is to provide a lighting device used for metrology and inspection of an EUV mask in an EUV exposure process of a semiconductor device manufacturing process, and includes one EUV light source 110, and a multilayer reflection zone plate 200 for creating EUV illumination light.

The EUV light generated from the EUV light source 110 makes the multilayer reflection zone plate 200 collect the $1^{st}$ light. The multilayer reflection zone plate 200 has a circular or oval pattern structure to diffract light, is combined with the multilayer film which can reflect the EUV light and diffracts the EUV light in the reflection direction, and collects the $1^{st}$ light of the EUV light. The EUV light source 110 collects Nd:YAG laser or COO2 laser to an Sn or Xe target using a lens or a mirror so as to create plasma. Here, the EUV light source uses light generated from the created plasma, light created from a bending magnet or an undulator of a synchrotron, or light generated from a free electron laser. Here, a wavelength area of the EUV light source ranges from 5 nm to 15 nm, and the wavelength applied to the present invention is the wavelength ranging from 12 nm to 15 nm and light ranging from 6 nm to 7 nm.

The multilayer reflection zone plate 200 for creating EUV illumination light is a reflector for creating illumination light on which an EUV reflective multilayer film is stacked, namely, is a planar substrate 210 on which the EUV reflective multilayer film 220 is stacked and a zone plate pattern 250 is formed on the EUV reflective multilayer film 220. Therefore, the multilayer reflection zone plate creates the EUV illumination light 300 by acquiring the $1^{st}$ diffraction light reflected after the EUV light output from the EUV light source 100 is radiated to the multilayer reflection zone plate.

Figure 4:
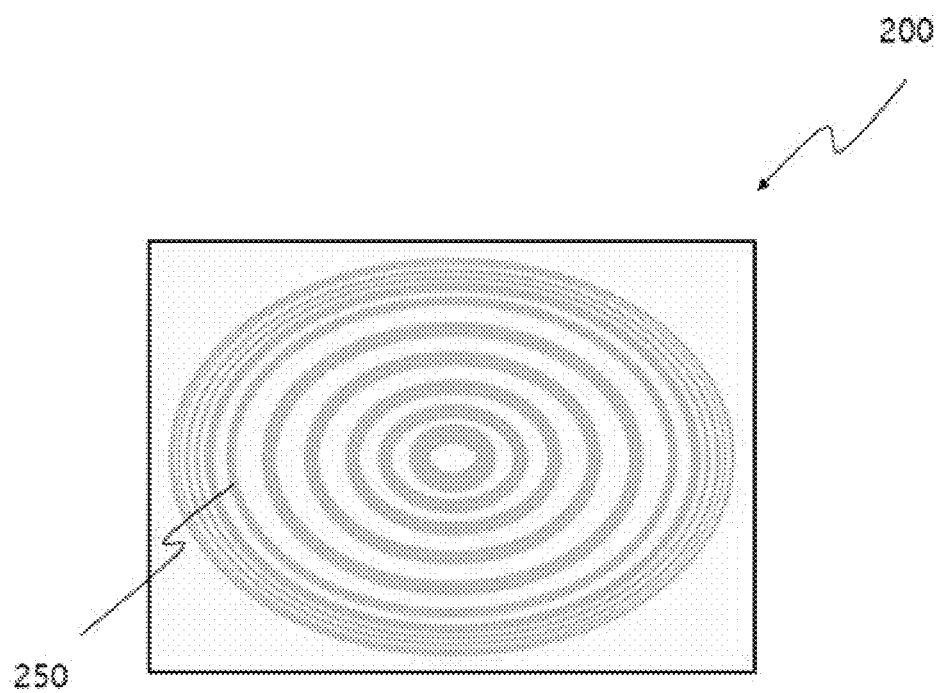
FIG. 4 is a plan view of a multilayer reflection zone plate of the lighting unit of the reflectivity and transmittance measuring device of the EUV mask and the EUV pellicle according to the present invention.

FIG. 4 is a plan view of a multilayer reflection zone plate of the lighting unit of the reflectivity and transmittance measuring device of the EUV mask and the EUV pellicle according to the present invention.

As illustrated in the drawing, the multilayer reflection zone plate 200 for creating EUV illumination light is a planar substrate, and forms a zone plate pattern after the EUV reflective multilayer film is stacked on the planar substrate. The multilayer reflection zone plate has a zone plate pattern 250 formed thereon in a circular or oval shape. The multilayer reflection zone plate 200 creates the $1^{st}$ diffraction light used as EUV illumination light through the zone plate pattern.

In this instance, an absorber for forming the zone plate pattern 250 blocks reflection of all lights or reflects some of lights, and can control features of illumination light by controlling reflection of light.

Here, if the height or width or duty cycle of the zone plate pattern is adjusted at each position of the multilayer reflection zone plate 200, $1^{st}$ light efficiency is adjusted at the position. If the $1^{st}$ light diffraction efficiency is adjusted at each position to be a desired amount, the zone plate pattern 250 is lighted since beam is connected by a periodic structure, and intensity of the connected beam by angle is adjusted so as to form intensity distribution of illumination beam by angle like the EUV exposure machine.

Furthermore, it is also possible to uniformly adjust intensity distribution of illumination beam by adjusting $1^{st}$ light efficiency by position of the multilayer reflection zone plate. Such technology is very effective in improvement of EVU inspection performance.

Figure 5:
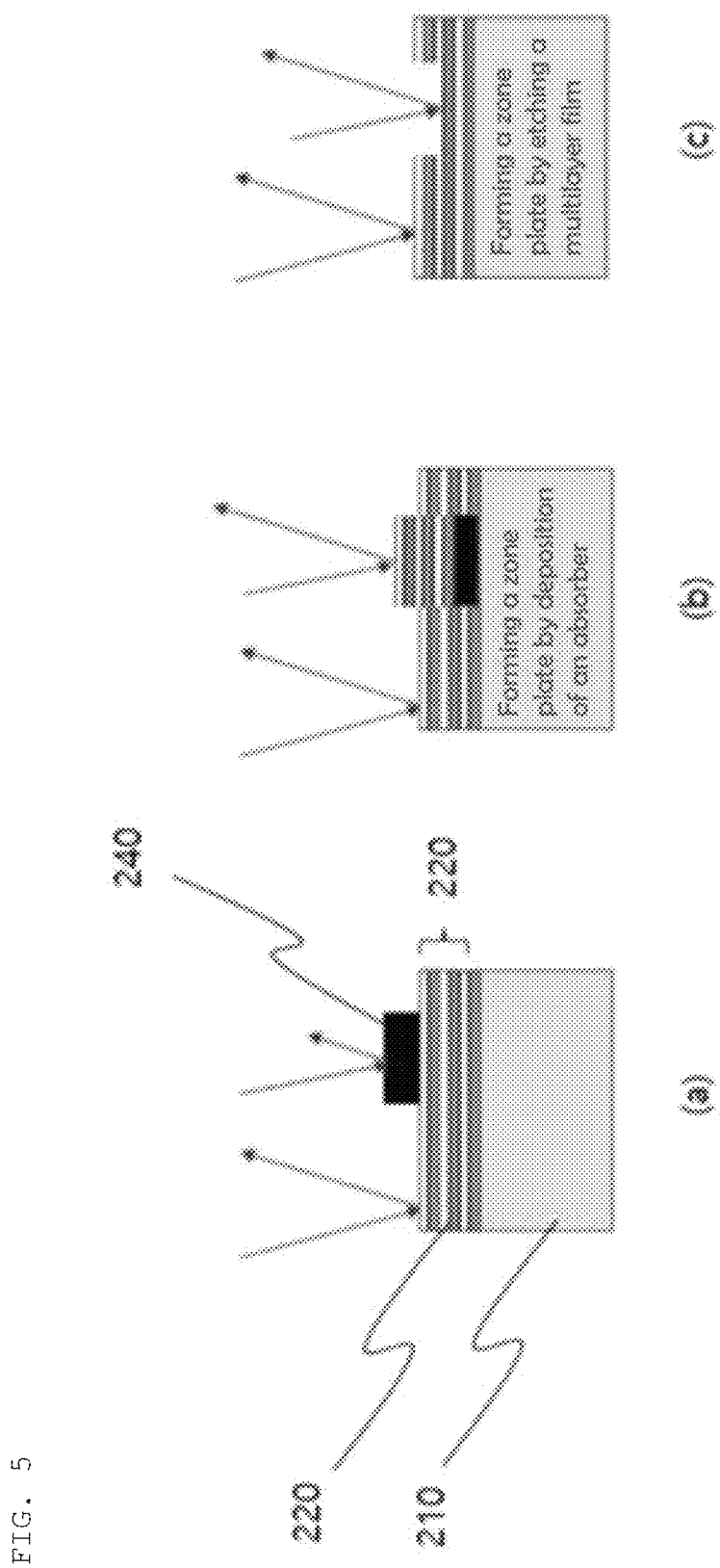
FIG. 5 is a sectional configuration diagram showing various examples of the multilayer reflection zone plate of FIG. 4.

FIG. 5 is a sectional configuration diagram showing various examples of the multilayer reflection zone plate of FIG. 4.

There are various methods to form the multilayer reflection zone plate according to the present invention. As illustrated in FIG. 5(*a*), an EUV reflection multilayer film 220 for forming a multilayer reflection film is stacked on one planar substrate 210, a plurality of absorbers 240 are formed on the surface of the EUV reflection multilayer film 220 so as to form a zone plate pattern. That is, one zone plate pattern is formed by the plurality of absorbers.

In this instance, the EUV reflection multilayer film is formed in such a way that at least two or more reflective materials are stacked repeatedly, and the absorber 240 can be controlled to absorb incident light or to reflect some of the incident light.

FIG. 5(*b*) illustrates a structure that the EUV reflection multilayer film is etched and the absorber is formed on the etched EUV reflection multilayer film, so that a zone plate pattern is formed on the inner surface of the multilayer film. In the case of FIG. 5(*a*), a zone plate pattern is formed on the surface of the multilayer film.

FIG. 5(*c*) illustrates that the EUV reflection multilayer film is etched along a predetermined pattern and a zone plate pattern is formed on the etched EUV reflection multilayer film.

The absorber 240 for forming the zone plate pattern blocks reflection of all lights or reflects some of lights, and the zone plate pattern is realized through E-beam lithography after deposition of the absorber, and the zone plate pattern can be formed by etching of the multilayer film through E-beam lithography.

Figure 6:
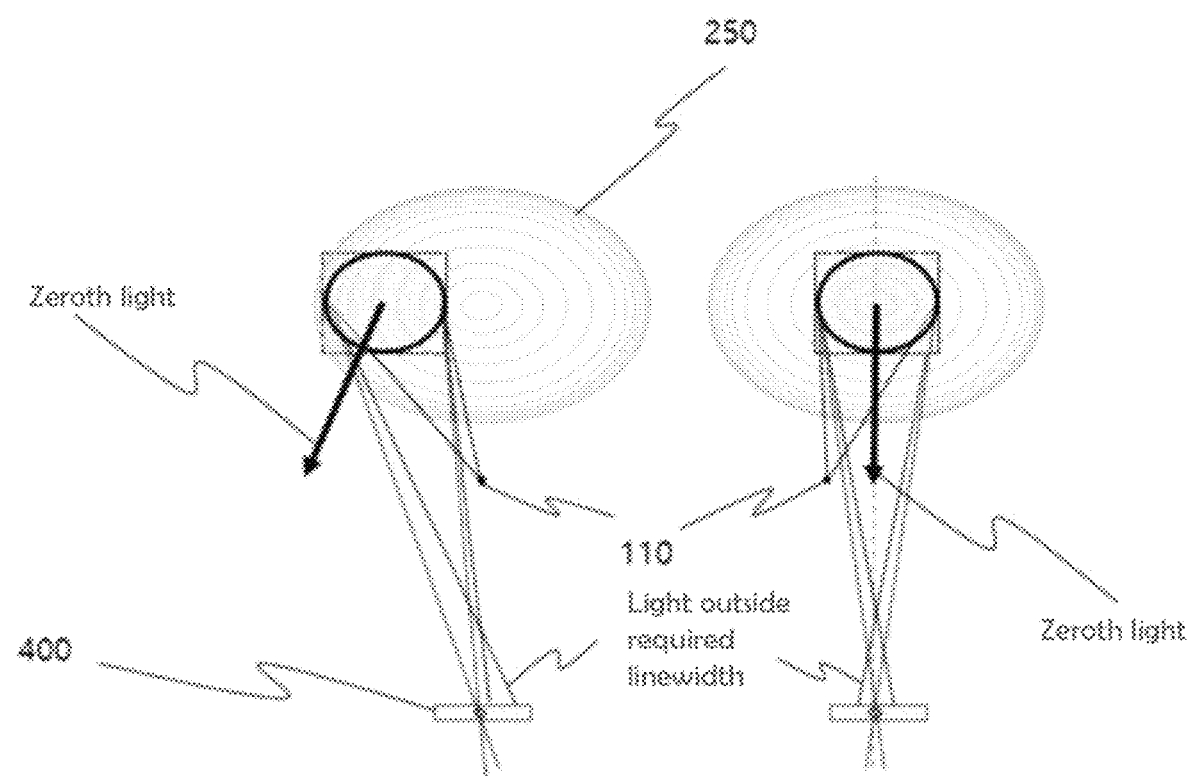
FIG. 6 is a view illustrating a lighting method of the lighting unit using the multilayer reflection zone plate according to the present invention.

FIG. 6 is a view illustrating a lighting method of the lighting unit using the multilayer reflection zone plate according to the present invention.

The zone plate pattern on the multilayer reflection zone plate 200 is formed in a circular or oval shape to collect the EUV light source to a sample. The zone plate may be an off-axis zone plate that the center of the circular or oval pattern does not exist in the multilayer reflection zone plate or an on-axis zone plate that the center of the circular or oval pattern exists in the multilayer reflection zone plate.

In the case of the off-axis zone plate, the center of zeroth light and the center of first light head in different directions, and in the case of the on-axis zone plate, the center of zeroth light and the center of first light are in the same direction. In order to obtain effect to narrow a broad wavelength linewidth of EUV light, an aperture 400 is formed around the collected illumination beam. In this instance, the off-axis zone plate is narrower in linewidth of monochromatic light than the on-axis zone plate since being combined with the aperture, but is shorter in required pattern cycle than the on-axis zone plate. Accordingly, it is possible to select one among the off-axis zone plate and the on-axis zone plate according to the linewidth of light sources and purposes of illumination beam.

If the linewidth of the wavelength of the EUV light source is broad, an aperture is added to create monochromatic light with narrow wavelength line width. The EUV light source used in the EUV lighting device according to the present invention uses EUV light having a wavelength area ranging from 5 nm to 15 nm. Some of users call light near 13.5 nm wavelength EUV light, and call light near 6.7 nm wavelength beyond EUV (BUV) light. In the present invention, wavelength ranging from 5 nm to 15 nm is designated as EUV light.

The EUV light source uses light which is created from plasma generated when Nd:YAG laser or CO2 laser is collected to a Sn or Xe target or is generated from a synchrotron. The present invention provides all technologies applicable to the created EUV light as well as the above-mentioned technology.

Figure 7:
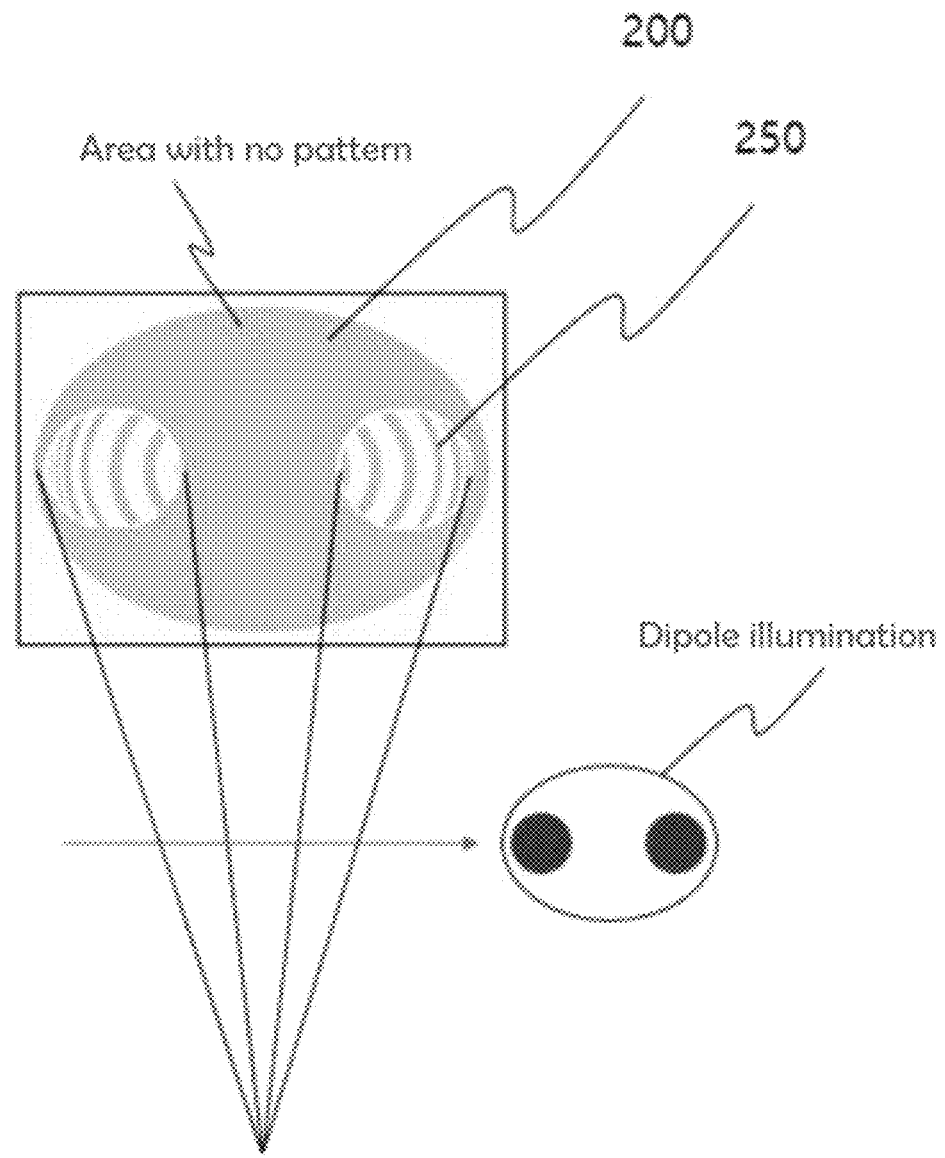
FIG. 7 is a view illustrating another lighting method of the lighting unit using the multilayer reflection zone plate according to the present invention.

FIG. 7 is a view illustrating another lighting method of the lighting unit using the multilayer reflection zone plate according to the present invention.

The multilayer reflection zone plate determines whether or not diffraction of light exists by spatially adjusting whether or not a zone plate pattern exists on the multilayer reflection zone plate 200 so as to embody binary illumination, and the binary illumination is applied to an EUV microscope so as to confirm optimization conditions for improving resolution of the microscope. Therefore, the binary illumination can be applied to be optimized in inspection sensitivity improvement of an inspection machine.

Figure 8:
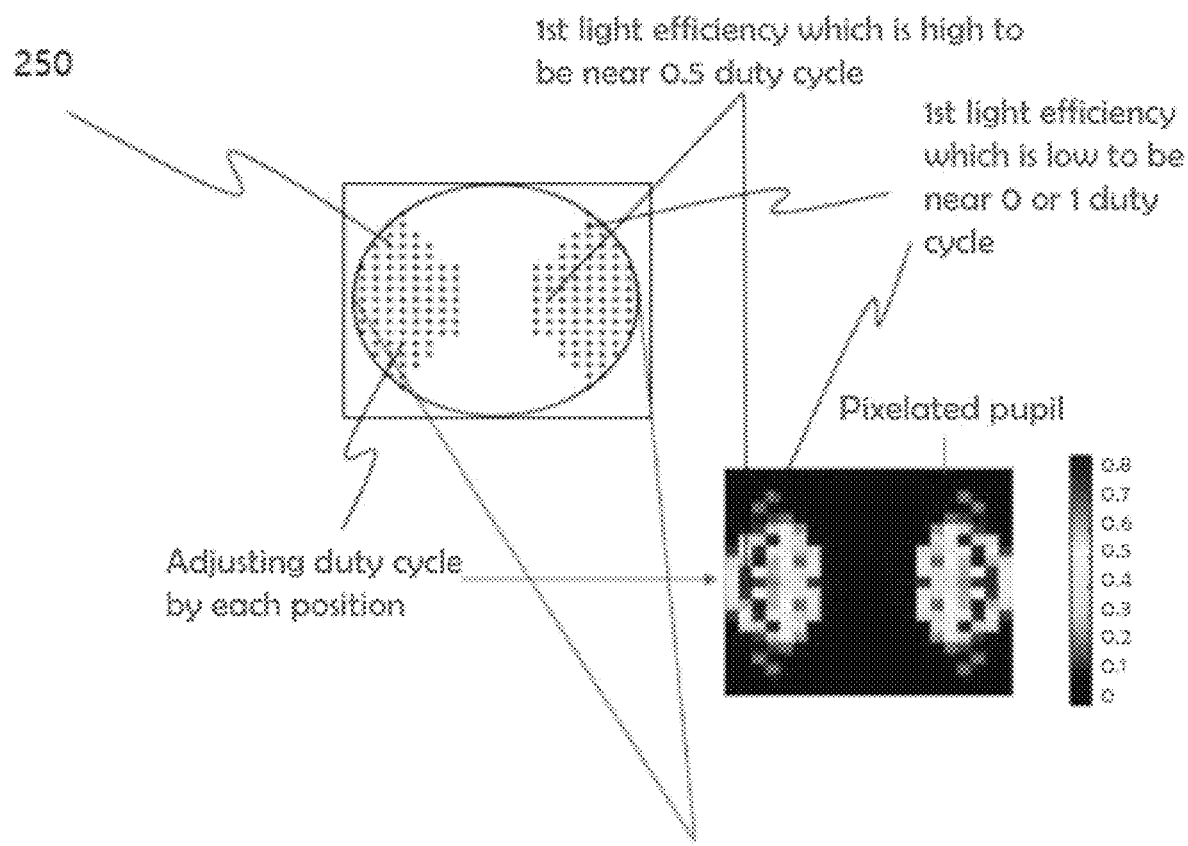
FIG. 8 is a detailed configuration diagram illustrating illumination light control of the EUV mask inspection device using the multilayer reflection zone plate according to the present invention.

FIG. 8 is a detailed configuration diagram illustrating illumination light control of the EUV mask inspection device using the multilayer reflection zone plate according to the present invention. When a duty cycle of a zone plate pattern or the height of absorber is spatially adjusted on the multilayer reflection zone plate 200, intensity of $1^{st}$ diffraction light in the spatial part is adjusted so as to embody freeform pupil illumination or pixelated pupil illumination. The freeform pupil illumination is applied to be optimized in improvement of resolution of a microscope or improvement of inspection sensitivity of an inspection machine, or the freeform pupil illumination is optimized to improve uniformity of beam radiated to a sample.

Figure 9:
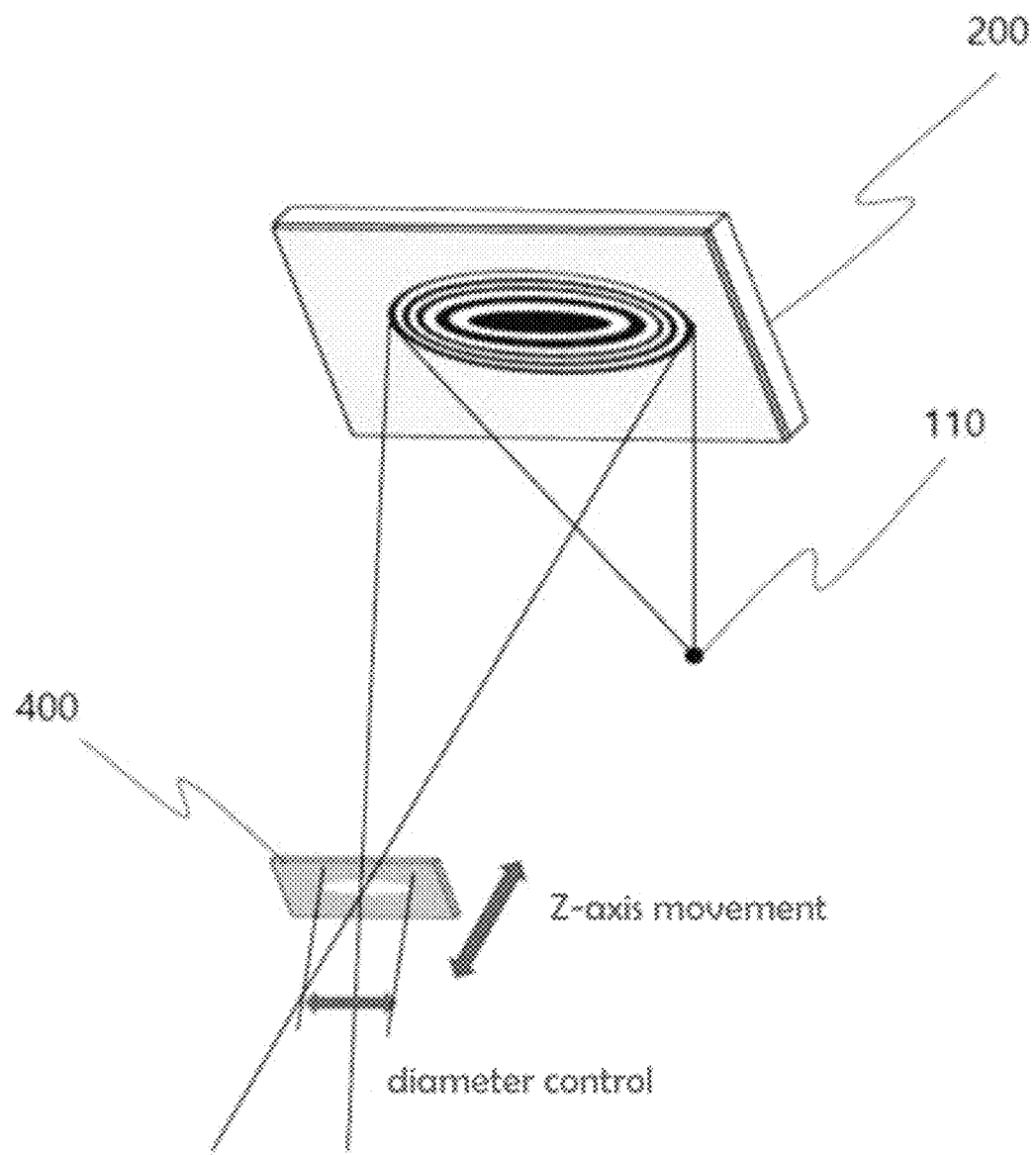
FIG. 9 is a configuration diagram for optical control of the reflectivity and transmittance measuring device of the EUV mask and the EUV pellicle according to the present invention.

FIG. 9 is a configuration diagram for optical control of the reflectivity and transmittance measuring device of the EUV mask and the EUV pellicle according to the present invention.

Because the diffracted light collected by the multilayer reflection zone plate 200 of the lighting unit is varied in collected position according to the wavelength, beam passing through the first aperture 400 becomes beam having fixed linewidth, and the central wavelength and linewidth of the beam are determined by position and diameter of the first aperture at each optical axis. Dispersion that a collection distance by the multilayer reflection zone plate 200 gets shorter when the wavelength gets longer but gets longer when the wavelength gets shorter is formed, so that a spectral bandwidth of the beam is determined according to the dispersion, the EUV light size, and the size of the first aperture 400. The minimum spectral bandwidth is determined by the dispersion of the multilayer reflection zone plate and the EUV light source size. However, if the size of the first aperture increases, the minimum spectral bandwidth may be adjusted in the increase direction of the bandwidth.

The central wavelength and linewidth of beam are determined according to the position and diameter of the first aperture 400, and the beam reaches the double-sided detector 500.

Figure 10:
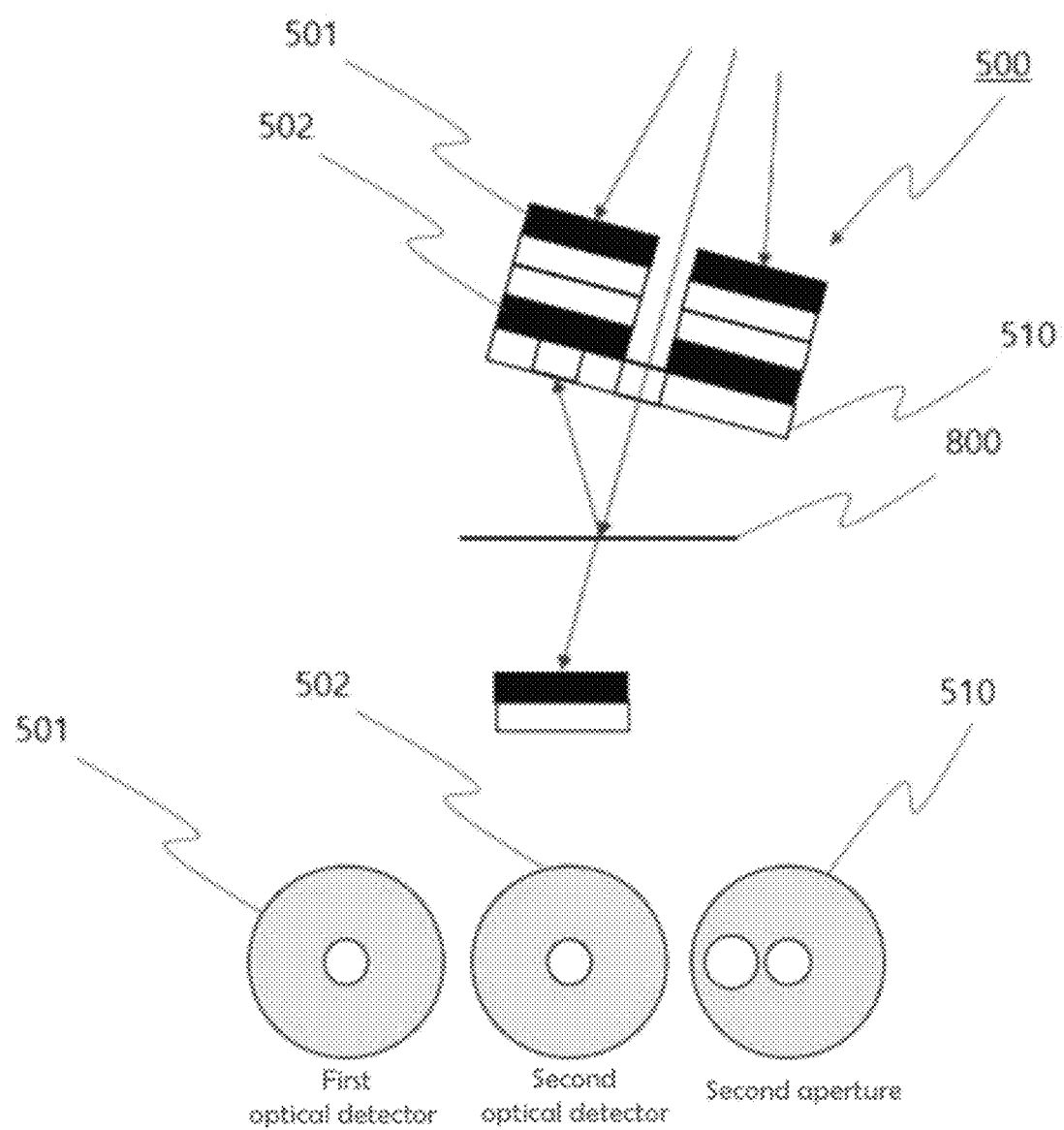
FIG. 10 is a detailed configuration diagram of a double-sided detector of the reflectivity and transmittance measuring device of the EUV mask and the EUV pellicle according to the present invention.

FIG. 10 is a detailed configuration diagram of a double-sided detector of the reflectivity and transmittance measuring device of the EUV mask and the EUV pellicle according to the present invention.

The double-sided detector 500 is a detecting unit having a first optical detector 501 and a second optical detector 502 formed at both sides thereof, and has a hole formed at the center. The double-sided detector 500 is manufactured to have detectable materials disposed at both sides or is made by combination of two single-sided detection elements respectively having holes, and the two single-sided detection elements are combined with each other in the opposite direction. The beam passing through the first aperture 400 reaches the double-sided detector 500, and in this instance, the position of the detector is adjusted so that the size of beam becomes smaller than a detectable size of the first optical detector. The beam measured after reaching the first optical detector becomes reference beam. Intensity of the reference beam becomes the standard for a time-based intensity change.

The beam passing through the hole formed at the center of the double-sided detector 500 is radiated to the EUV mask or the EUV pellicle. Reference light intensity is measured in front of the double-sided detector, and light transmitted from the central hole, which is a part of the reference light intensity, is radiated to the sample. Therefore, a change in light intensity radiated to the sample can be confirmed through reference light intensity measurement. Light radiated to the sample is transmitted and reflected, transmitted light intensity is measured by the optical detector 600 which is a transmitted light detecting device installed at the back of the sample, and the second optical detector 502 installed at the rear surface of the double-sided detector measures light reflected from the sample. When there is no sample, reference light intensity and transmitted light intensity are measured by the front surface of the double-sided detector 500 and the optical detector 600. In this instance, because there is no sample and there is no loss of transmitted light, the transmitted light intensity is equal to radiated light intensity when there is a sample. Therefore, correlation between reference light intensity and radiated light intensity can be measured. That is, percentage of the reference light intensity corresponding to the radiated light can be calculated.

When light reflected from the sample is measured by the second optical detector 502, light scattered from the sample in a wide angle range may act as noise in measurement of reflectivity. In order to prevent the above, a second aperture 510 is formed in the whole surface of the second optical detector 502 in order to detect only the light reflected at the predetermined angle range. As illustrated in the drawing, in order to detect only the light reflected from the sample at the predetermined angle range, the second aperture 510 has a hole formed at the center so that measured light passes, and another hole for detecting only the light reflected from the sample so as to measure reflected light.

Figure 11:
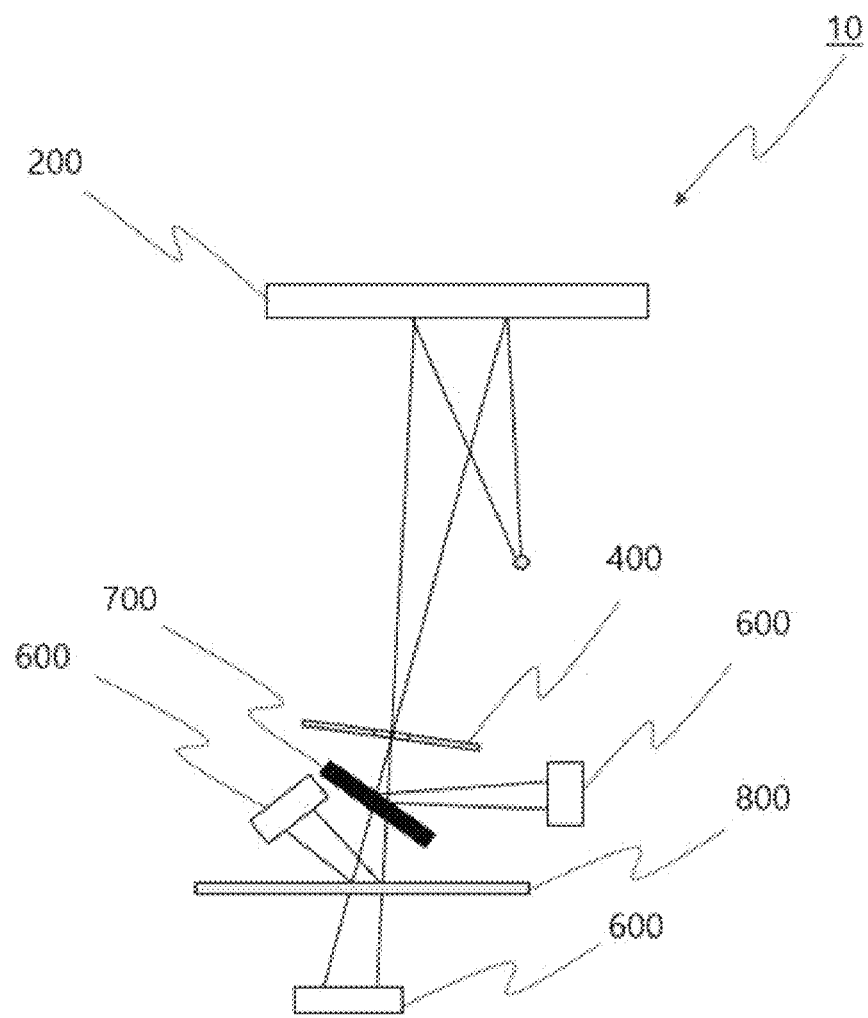
FIG. 11 is a configuration diagram illustrating a reflectivity and transmittance measuring device of an EUV mask and an EUV pellicle according to another embodiment of the present invention.

FIG. 11 is a configuration diagram illustrating a reflectivity and transmittance measuring device of an EUV mask and an EUV pellicle according to another embodiment of the present invention. In FIG. 11, not the double-sided detector but a beam splitter 700 is applied so as to apply an optical design to measure reflected light and transmitted light by each optical detector.

Instead of the double-sided detector 500, the beam splitter with an EUV wavelength and a reference light detector and a reflected light detector are mounted to carry out the same role. In order to detect light reflected from the beam splitter 700, transmitted light, and light reflected from the sample, a plurality of optical detectors 600 are disposed to measure reference light and reflected light.

The EUV reflectivity and transmittance measuring device having the multilayer reflection zone plate according to the present invention is considerably improved in measurement speed and reliability since having light harvesting efficiency of a monochromator and a simple optical system structure.

The EUV reflectivity and transmittance measuring device can collect and divide the EUV light by the multilayer reflection zone plate and the first aperture, the light is divided into reflected light (reference light) by the beam splitter and transmitted light (light radiated to the sample), intensity of the reference light reflected from the beam splitter is measured by a reference light measuring optical detector, the radiated light transmitted from the beam splitter is radiated to the sample, intensity of the light reflected from the sample is measured by a reflectivity measuring optical detector, and intensity of the light transmitted from the sample is measured by a transmittance measuring optical detector. Therefore, through the light intensity measurement of the reference light, the reflected light, and the transmitted light measured by the optical detectors, the EUV reflectivity and transmittance measuring device can measure reflectivity of the EUV mask or reflectivity and transmittance of the EUV pellicle.

Figure 12:
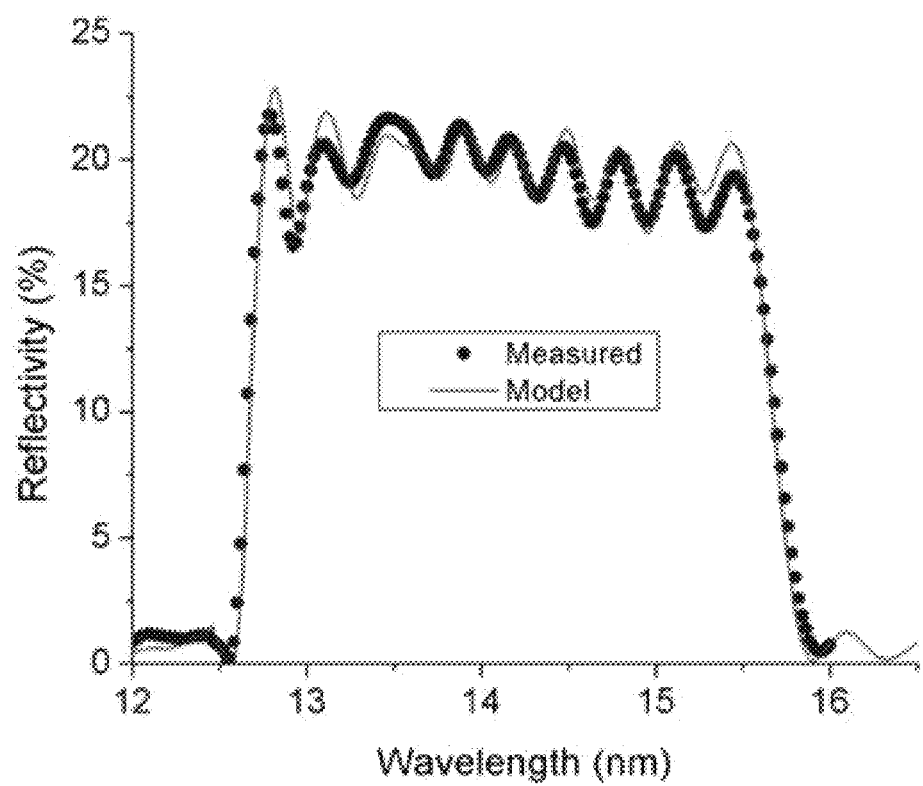
FIG. 12 is a view illustrating a reflectivity measuring result according to multilayer wavelength through the reflectivity and transmittance measuring device of the EUV mask and the EUV pellicle according to the present invention.

FIG. 12 is a view illustrating a reflectivity measuring result according to multilayer wavelength through the reflectivity and transmittance measuring device of the EUV mask and the EUV pellicle according to the present invention.

The multilayer reflection zone plate according to the present invention is a core optical element serving as an important role in the whole system. When reflectivity and transmittance of the EUV mask or the EUV pellicle are measured, measurement of various wavelengths is needed according to users' demands. FIG. 12 illustrates reflectivity of the multilayer film, which reflects EUV light on the multilayer reflection zone plate, which was manufactured experimentally, in an EUV wavelength area. As a measurement and calculation result, reflectivity was more than 15% in a wide range from 12.7 nm to 15.6 nm. The multilayer reflection zone plate applied to the present invention can provide light necessary for measurement since the EUV mask and the EUV pellicle for EUV lithography using the wavelength of about 13.5 nm have a measurement wavelength ranging from 13 nm to 14 nm. If necessary, it is possible to manufacture a multilayer film structure capable of obtaining reflectivity with a desired wavelength ranging from 5 nm to 15 nm.

As described above, while the present invention has been particularly shown and described with reference to the example embodiments thereof, it will be understood by those of ordinary skill in the art that various changes, modifications and equivalents may be made in the present invention without departing from the technical scope and idea of the present invention. Therefore, it would be understood that the present invention is not limited by the changes, modifications and equivalents but is limited by the following claims.

What is claimed is:

1. A reflectivity and transmittance measuring device of an EUV mask and an EUV pellicle used in an EUV exposure process of a semiconductor device manufacturing process, which includes: an EUV light source for outputting EUV light with a wavelength ranging from 5 nm to 15 nm; a multilayer reflection zone plate having an EUV reflection multilayer film, which is a planar substrate, and a zone plate pattern; and an EUV lighting unit for creating EUV illumination light by obtaining $1^{st}$ diffraction light reflected after radiating EUV light output from the EUV light source to the multilayer reflection zone plate, the reflectivity and transmittance measuring device comprising:
   a first aperture for providing monochromatic light or reducing a light radiation area by reducing a linewidth of optical wavelength radiated from the EUV lighting unit;
   a double-sided detector which detects reference light relative to the incidence direction of light passing through the aperture and has optical detection units disposed at both sides thereof to detect again the light reflected after being radiated to the EUV mask after passing through a hole formed at the center; and
   an optical detector for detecting the light transmitted after being radiated to the EUV mask after passing through a central hole formed in the double-sided detector.

2. The reflectivity and transmittance measuring device according to claim 1, wherein the multilayer reflection zone plate comprises:
   one planar substrate;
   an EUV reflective multilayer film stacked on the planar substrate; and
   a zone plate pattern formed on the surface or the inner face of the EUV reflective multilayer film.

3. The reflectivity and transmittance measuring device according to claim 2, wherein the zone plate pattern is formed on the EUV reflective multilayer film by repeatedly stacking at least two or more reflective materials, and
   wherein the zone plate pattern is formed in such a way that absorber materials are stacked along a predetermined pattern, that the EUV reflection multilayer film is etched along the predetermined pattern, or that an absorber material is stacked and the EUV reflection multilayer film is stacked on the absorber material.

4. The reflectivity and transmittance measuring device according to claim 3, wherein the zone plate pattern is formed on the surface or the inner face of the EUV reflective multilayer film in such a way that absorber materials are stacked along a predetermined pattern, that the EUV reflection multilayer film is etched along the predetermined pattern, or that an absorber material is stacked and the EUV reflection multilayer film is stacked on the absorber material.

5. The reflectivity and transmittance measuring device according to claim 2, wherein the zone plate pattern has a circular or oval shape,
   wherein the zone plate is an off-axis zone plate that the center of the circular or oval pattern does not exist in the multilayer reflection zone plate, or is an on-axis zone plate that the center of the circular or oval pattern exists in the multilayer reflection zone plate, and
   wherein in the case of the off-axis zone plate, the center of zeroth light and the center of first light head in different directions, and in the case of the on-axis zone plate, the center of zeroth light and the center of first light are in the same direction.

6. The reflectivity and transmittance measuring device according to claim 1, wherein the double-sided detector further comprises a second aperture formed in the surface of the optical detector in order to measure some of reflected light of measured light radiated from the EUV mask when some of the reflected light passes through the second aperture.

7. The reflectivity and transmittance measuring device according to claim 6, wherein the second aperture comprises: a first hole formed at the center so that the measured light radiated to the EUV mask passes through the first hole; and a second hole formed to be distant from the first hole so that the light reflected after the measured light is radiated to the EUV mask passes through the second hole.

* * * * *